US009746785B2

(12) United States Patent
Van Der Schaar et al.

(10) Patent No.: US 9,746,785 B2
(45) Date of Patent: Aug. 29, 2017

(54) SUB-WAVELENGTH SEGMENTATION IN MEASUREMENT TARGETS ON SUBSTRATES

(75) Inventors: Maurits Van Der Schaar, Eindhoven (NL); Marcus Adrianus Van De Kerkhof, Helmond (NL); Sami Musa, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 632 days.

(21) Appl. No.: 12/995,529

(22) PCT Filed: May 27, 2009

(86) PCT No.: PCT/EP2009/056431
§ 371 (c)(1),
(2), (4) Date: May 4, 2011

(87) PCT Pub. No.: WO2010/009930
PCT Pub. Date: Jan. 28, 2010

(65) Prior Publication Data
US 2011/0204484 A1    Aug. 25, 2011

Related U.S. Application Data

(60) Provisional application No. 61/129,049, filed on Jun. 2, 2008.

(51) Int. Cl.
*G01B 11/00* (2006.01)
*H01L 23/544* (2006.01)
(Continued)

(52) U.S. Cl.
CPC ...... *G03F 7/70566* (2013.01); *G03F 7/70633* (2013.01); *G03F 9/7065* (2013.01);
(Continued)

(58) Field of Classification Search
CPC .............. G03F 7/70633; G03F 9/7076; H01L 2223/54426; H01L 23/544
(Continued)

(56) References Cited

U.S. PATENT DOCUMENTS 6,420,791 B1 * 7/2002 Huang et al. .................. 257/797
6,982,793 B1   1/2006 Yang et al.
(Continued)

FOREIGN PATENT DOCUMENTS

| EP | 1400860 A2 * | 3/2004 |
|---|---|---|
| EP | 1 628 164 A2 | 2/2006 |
| EP | 1 400 860 A3 | 3/2009 |

OTHER PUBLICATIONS

Grann, E. B. et al., Artificial uniaxial and biaxial dielectrics with use of two-dimensional subwavelength binary gratings, J. Opt. Soc. Am. A, vol. 11, No. 10 (Oct. 1994), pp. 2695-2703.*
(Continued)

*Primary Examiner* — Kara E Geisel
*Assistant Examiner* — Violeta A Prieto
(74) *Attorney, Agent, or Firm* — Sterne, Kessler, Goldstein & Fox P.L.L.C.

(57) ABSTRACT

Measurement targets for use on substrates, and overlay targets are presented. The targets include an array of first regions alternating with second regions, wherein the first regions include structures oriented in a first direction and the second regions include structures oriented in a direction different from the first direction. The effective refractive index of the two sets of regions are thereby different when experienced by a polarized beam, which will act as a TM-polarized beam when reflected from the first set of regions, but as a TE-polarized beam when reflected from the second set of regions.

21 Claims, 3 Drawing Sheets

(51) Int. Cl.
*G03F 7/20* (2006.01)
*G03F 9/00* (2006.01)

(52) U.S. Cl.
CPC .......... *G03F 9/7076* (2013.01); *H01L 23/544* (2013.01); *H01L 2223/54426* (2013.01); *H01L 2924/0002* (2013.01)

(58) Field of Classification Search
USPC .......................... 356/401, 614, 620; 257/797
See application file for complete search history.

(56) References Cited

U.S. PATENT DOCUMENTS

| | | | |
|---|---|---|---|
| 7,230,703 B2 | 6/2007 | Sezginer et al. | |
| 7,573,584 B2* | 8/2009 | Den Boef | G03F 7/70633 356/400 |
| 7,835,080 B2* | 11/2010 | Taguchi et al. | 359/574 |
| 2002/0001761 A1* | 1/2002 | Mizutani et al. | 430/5 |
| 2002/0158193 A1* | 10/2002 | Sezginer et al. | 250/237 G |
| 2003/0026471 A1* | 2/2003 | Adel et al. | 382/144 |
| 2003/0044702 A1* | 3/2003 | Schulz | 257/797 |
| 2003/0174945 A1* | 9/2003 | Fried | G02B 6/10 385/37 |
| 2004/0066517 A1* | 4/2004 | Huang et al. | 356/509 |
| 2004/0114143 A1* | 6/2004 | Van Haren et al. | 356/401 |
| 2005/0012928 A1* | 1/2005 | Sezginer et al. | 356/401 |
| 2005/0157297 A1* | 7/2005 | Abdulhalim et al. | 356/401 |
| 2006/0208360 A1* | 9/2006 | Yiu et al. | 257/750 |
| 2006/0256322 A1* | 11/2006 | Bowes | 356/124 |
| 2006/0279735 A1 | 12/2006 | Van Haren et al. | |
| 2007/0052113 A1* | 3/2007 | Marokkey et al. | 257/797 |
| 2007/0077503 A1* | 4/2007 | Yoo | 257/797 |
| 2008/0074666 A1* | 3/2008 | Boef | G03F 7/70633 356/400 |
| 2008/0111995 A1* | 5/2008 | Lee | G03F 7/70625 356/499 |
| 2009/0002706 A1* | 1/2009 | Weiss et al. | 356/369 |

OTHER PUBLICATIONS

Lalanne, Philippe et al., Antireflection behavior of silicon subwavelength periodic structures for visible light, Nanotechnology 8 (1997), pp. 53-56.*

Moharam, M. G. et al., Analysis and Design of Binary Gratings for Broadband Infrared Low Reflectivity Surfaces, SPIE vol. 1485 Reflective and Refractive Optical Materials for Earth and Space Applications (1991), pp. 254-259.*

International Preliminary Report on Patentability with Written Opinion of the International Searching Authority directed to related International Patent Application No. PCT/EP2009/056431, mailed Dec. 16, 2010 from The International Bureau of WIPO; 7 pages.

International Search Report directed to related International Patent Application No. PCT/EP2009/056431, mailed Sep. 28, 2009; 3 pages.

* cited by examiner

SUB-WAVELENGTH SEGMENTATION IN MEASUREMENT TARGETS ON SUBSTRATES

CROSS-REFERENCE TO RELATED APPLICATIONS

This application claims the benefit of U.S. provisional application 61/129,049, which was filed on Jun. 2, 2008, and which is incorporated herein in its entirety by reference.

FIELD

The present invention relates to methods of inspection usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is desirable to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

The pattern is transferred onto several successive resist layers on the substrate in order to build up a multi-layer structure with the pattern throughout its thickness. It is therefore desirable to ensure that the pattern in any given layer is exactly aligned with the pattern in the previous layer. The way that successive patterned layers are aligned is by having overlay targets in the layer, these overlay targets being detectable by an inspection beam that is projected by the projection system before the exposure beam is projected to apply the pattern. In order to leave as much space as possible on the substrate for the exposed pattern, the overlay targets are positioned in scribe lanes, which is the part of the substrate that will be sawn to separate the substrate into individual ICs, for example. Overlay targets have, in the past, taken the form of stacked (in several or all the layers) copper areas alternating with dielectric areas. Overlay targets may also be used for alignment of a substrate with respect to a substrate table or other fixed object.

As lithographic techniques improve and smaller patterns are possible, smaller ICs are also possible and so the area between the scribe lanes decreases. If the scribe lanes stay the same size while the "usable" area between them gets smaller, the ratio of unusable substrate to usable substrate increases, reducing efficiency of the substrate use. The present use of relatively large copper areas in the overlay targets in the scribe lanes means that the size of the scribe lanes is difficult to decrease and so inefficient use of substrate space is inevitable. Overlay targets are typically in the form of gratings made up of parallel bars. The pitch of the grating should be a similar order of magnitude to the product that is eventually to be manufactured on the substrate so that overlay to the correct accuracy can be measured. Presently, the minimum pitch available is around 400 nm. However, modern designs generally require a pitch of 300 nm or smaller. For this to be workable, the wavelength of the inspection beam used to irradiate the target would need to be less than 450 nm. However, tuning tolerance with a beam this high in frequency would be very limited.

SUMMARY

It is desirable to create an overlay target on a substrate that will allow scribe lane space to be decreased and thereby allow more efficient use of the space on a substrate. It is also desirable to create an overlay target on a substrate that will have features small enough to be of use for very small product designs, but which will also be measurable.

According to an aspect of the invention, there is provided a target for use on a substrate, the target including an array of first regions alternating with second regions, wherein the first regions include structures oriented in a first direction and the second regions include structures oriented in a direction different from the first direction.

According to another aspect of the present invention, there is provided a substrate including a target including an array of first regions alternating with second regions, wherein the first regions include structures oriented in a first direction and the second regions include structures oriented in a direction different from the first direction.

According to a further aspect of the present invention, there is provided an inspection method for inspecting the overlay of a pattern on a substrate, including: providing, superimposed on the pattern on the substrate, a target including an array of first regions alternating with second regions, the first regions including structures oriented in a first direction and the second regions including structures oriented in a direction different from the first direction;

illuminating the target with a polarized inspection radiation beam; detecting the reflected polarized inspection radiation beam from the target; and determining, from the properties of the reflected polarized inspection radiation beam, whether the target is in alignment with the pattern.

According to a yet further aspect of the present invention, there is provided a further inspection method for inspecting the overlay of a pattern on a substrate, including: providing an array of first regions containing reflective structures superimposed on the pattern on a substrate; providing an array of second regions containing reflective structures interleaved with the first regions, the reflective structures of the second regions being arranged perpendicularly to the reflective structures of the first regions; illuminating the first and second regions with a polarized inspection radiation beam including a wavelength that is equal to or greater than the distance between the reflective structures multiplied by the refractive index of a material containing the reflective structures; detecting the reflected polarized inspection radiation beam; and determining, from the properties of the reflected polarized inspection radiation beam, whether the first and second regions are in alignment with the pattern.

According to a yet further aspect of the present invention, there is provided a method for creating a target on a substrate, including: depositing, onto the substrate, a layer containing an array of first regions alternating with second regions, wherein the first regions include structures oriented in a first direction and the second regions include structures oriented in a direction different from the first direction.

According to a yet further aspect of the present invention, there is provided a device manufacturing method including projecting a patterned beam of radiation onto a substrate, wherein the substrate contains a target including an array of first regions alternating with second regions, wherein the first regions include structures oriented in a first direction and the second regions include structures oriented in a direction different from the first direction.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
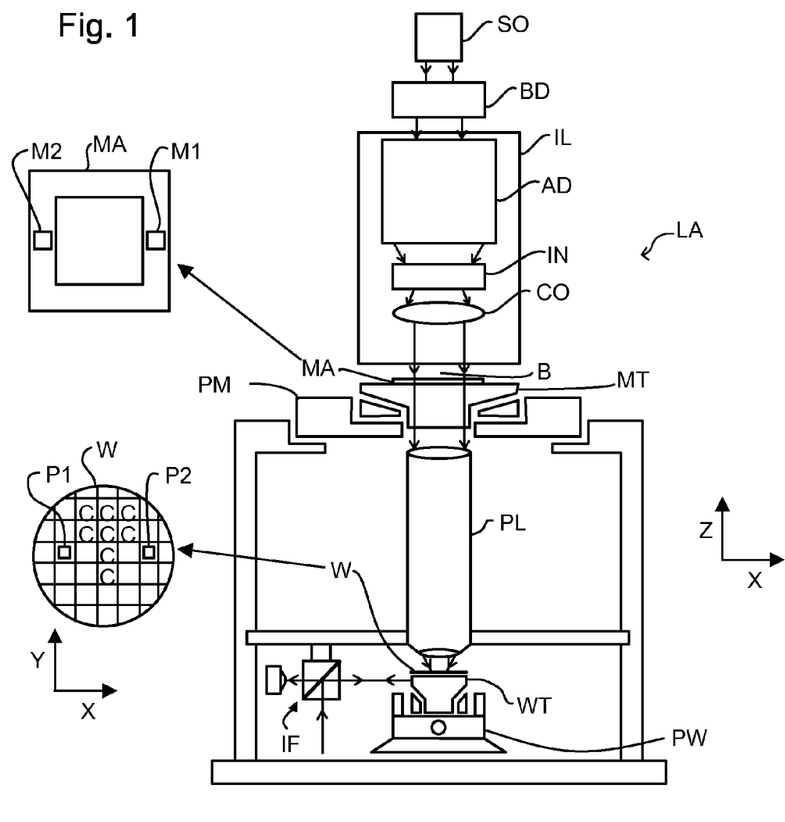
FIG. 1 depicts a lithographic apparatus in accordance with an embodiment of the invention.

FIG. 1 schematically depicts a lithographic apparatus. The apparatus includes an illumination system (illuminator) IL configured to condition a radiation beam B (e.g. UV radiation or DUV radiation); a patterning device support or support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device support (e.g. mask table) MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
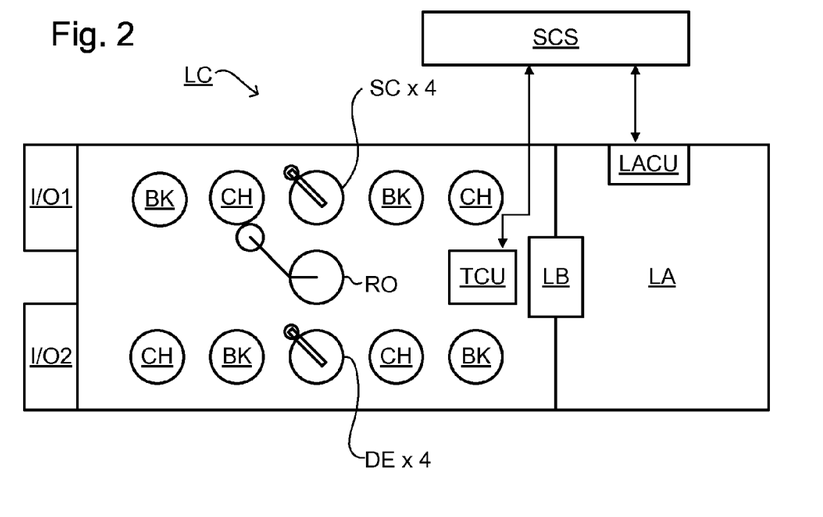
FIG. 2 depicts a lithographic cell or cluster in accordance with an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded—thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
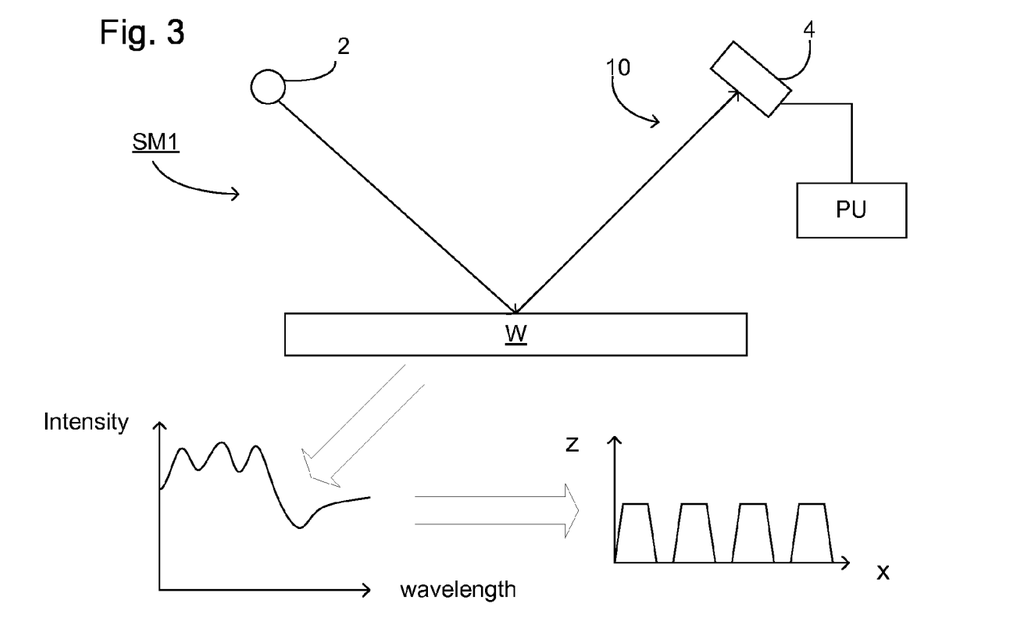
FIG. 3 depicts a first scatterometer in accordance with an embodiment of the invention.

FIG. 3 depicts a scatterometer SM1 which may be used in an embodiment of the present invention. It includes a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
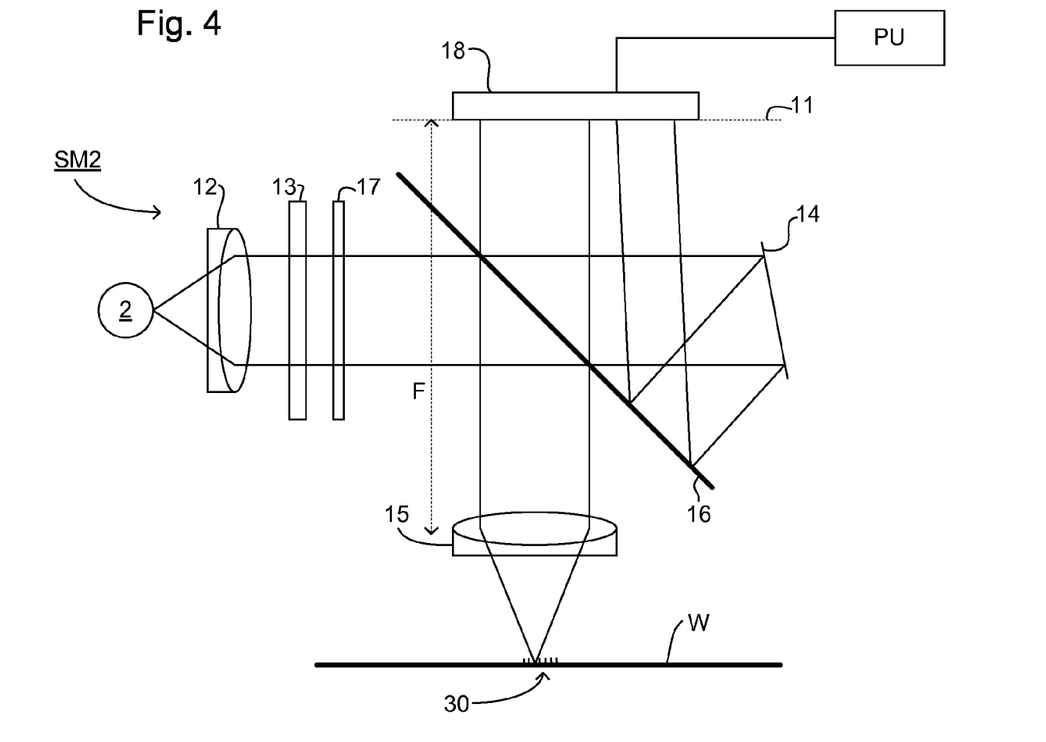
FIG. 4 depicts a second scatterometer in accordance with an embodiment of the invention.

Another scatterometer SM2 that may be used with an embodiment of the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than including a set of different filters. A grating could be used instead of interference filters.

The detector 18 may measure the intensity of scattered radiation at a single wavelength (or narrow wavelength range), the intensity separately at multiple wavelengths or integrated over a wavelength range. Furthermore, the detector may separately measure the intensity of transverse magnetic- and transverse electric-polarized radiation (light) and/or the phase difference between the transverse magnetic- and transverse electric-polarized radiation (light).

Using a broadband radiation (light) source (i.e. one with a wide range of radiation (light) frequencies or wavelengths—and therefore of colors) is possible, which gives a large etendue, allowing the mixing of multiple wavelengths. The plurality of wavelengths in the broadband preferably each has a bandwidth of $\delta\lambda$ and a spacing of at least $2\delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

To measure properties of the exposed pattern on a substrate, a test pattern may be used that has known (or at least measurable) parameters. This test pattern may be known as a mark or target 30. The target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

It is desirable to ensure that each time the exposure beam is projected onto the substrate, it is aligned with the pattern already existing on the substrate. The alignment of one layer with another is known as overlay. In order to measure the overlay of subsequent layers on a substrate, overlay targets are present in a number of the layers of resist. The overlay targets may be the same targets that are used to measure the alignment of the projection system and patterning device with respect to the substrate and to the existing pattern on the substrate. A radiation beam (which may be from the same source as—or a different source from—the exposure beam that will expose each layer of resist thus creating a pattern on each layer) is reflected from the overlay target and diffracts. Any misalignment of the overlay target with one underneath it in a previously exposed layer may give rise to specific corresponding features in the diffraction spectrum of the reflected radiation beam. These features can be compared with a library of features to enable the determination of the overlay error that caused the diffraction spectrum feature (usually measured as an asymmetry in the first diffraction order of the diffraction spectrum).

For processing reasons, the overlay target dimensions should resemble the device/product dimensions to guarantee alignment accuracy. The overlay target may be in a scribe lane, which is an area between product ("in-die") areas that is subsequently destroyed during sawing of the substrate into its component products. Alternatively, the overlay target may be in-die, but should then not interact with the product. Generally, the reason to have the overlay target in the scribe lane is that the precious real estate of the substrate reserved for the product is less likely to be compromised or filled up. However, there are many marks and targets that should be in the scribe lane and so it is desirable to be able to produce an overlay target that can be included in-die and that will not interact with the product.

The key to having overlay targets in-die but that do not interact with the exposure of the pattern is to have overlay targets that can be inspected by the scattering of an inspection beam, but that do not scatter an exposure beam. This may lead to overlay targets being incorporated in the pattern, without compromising the pattern. This, in turn, reduces the space required in scribe lanes.

An embodiment of the present invention uses the fact that the exposure wavelength may be much smaller than the inspection wavelength. An inspection beam may be infra-red radiation or visible radiation (light), for example (i.e. any wavelength that will not affect the resist layers on the substrate), while an exposure wavelength is usually ultra-violet or similar, thus having a smaller wavelength than the inspection beam.

Figure 5:
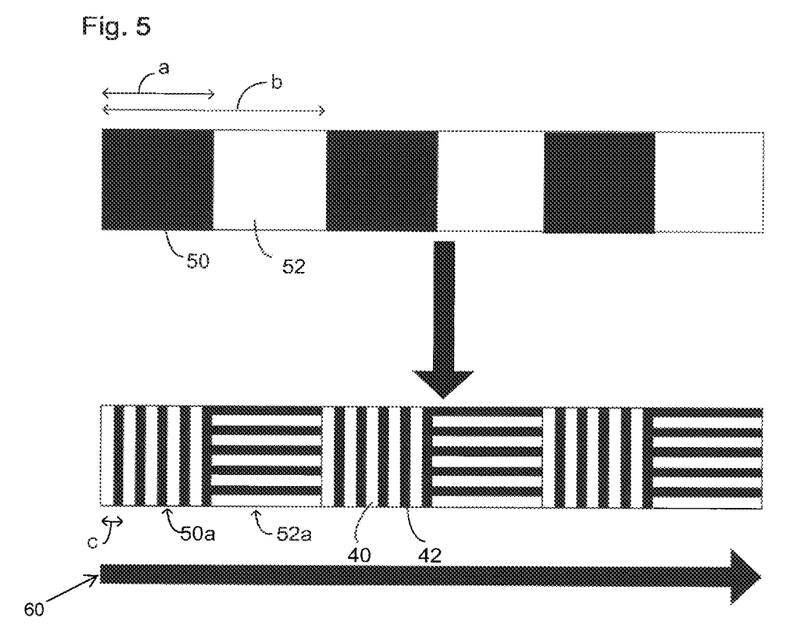
FIG. 5 depicts an overlay target according to the state of the art and according to an embodiment of the present invention.

The top figure of FIG. 5 shows a section of a standard overlay target. The grating includes bars 50 with spaces 52 in between them. The width or critical dimension (CD) of the bar 50 of the grating may have a width a. The pitch b of the grating is the distance before the pattern of bars and spaces repeats; in this example, one bar 50 and one space 52 (as all of the bars and spaces are the same width).

Ways to change the relationship of the CD and pitch have been considered in the past. Interlaced gratings with different CDs and/or different pitches give different effective pitches and duty cycles (CD divided by pitch). However, even with interlaced gratings, the duty cycle has typically been of the order of 50% and the pitch, of the order of 400, 500, 750 or 1000 nm. Modern product designs need overlay to be measurable for smaller sizes. Pitches of 300 nm or less are desirable. However, for this sort of size, the inspection radiation would need to have a wavelength of about 450 nm or less. The tolerance for tuning the polarization, wavelength, aperture, etc., is very limited with this sort of wavelength.

An embodiment of the present invention seeks to solve this size problem by sub-segmenting areas of the overlay target. The typical dimensions of the sub-segmentation can be around or smaller than the wavelength of the inspection beam but can be larger than the wavelength of an exposure beam. This can make the areas transparent for the wavelength of the exposure beam; i.e. so that the exposure beam cannot sense the structures and therefore not be used for inspection. It will be appreciated that the target may be produced with the smaller lines 42 and spaces 40 directly, rather than sub-segmenting of an existing grating being part of a manufacturing process.

In the embodiment shown in the bottom of FIG. 5, both the lines (or bars 50) as well as the spaces 52 of the grating (the target 30) are sub-segmented, each substantially perpendicularly with respect to each other. In other words, the bars 50 are segmented into smaller bars 42 in one direction, for example, perpendicular to the grating vector direction 60. There are still spaces 40 between the smaller bars 42. However, the spaces 52 of the original target are also sub-segmented, preferably in a direction perpendicular to the direction of the bars 42, i.e. parallel to the grating vector direction 60. There are therefore regions 50a and 52a with sub-segmentations perpendicular to each other alternating along the grating vector direction. These segments or regions may have the same pitch c as each other, or different pitches from each other. The bars 42 need not be perpendicular to each other. Any difference in orientation that affects a polarized incident beam differently may be used.

When sub-segmenting the target with pitches smaller than $\lambda/n$, with n being the refractive index of the material in which the target is created and $\lambda$ being the wavelength of the inspection radiation, the sub-segmented regions 50a and 52a will behave as artificial anisotropic materials that have different effective refractive indices alternating along the grating vector direction 60. The array of alternating regions 50a and 52a may extend perpendicularly to the grating vector direction 60, too.

The key with an anisotropic material is that orthogonally polarized beams (transverse magnetic (TM) and transverse electric (TE) beams) will act differently in the different segments 50a and 52a of the sub-segmented target because the effective refractive index of the segments 50a and 52a will be different.

Figure 6:
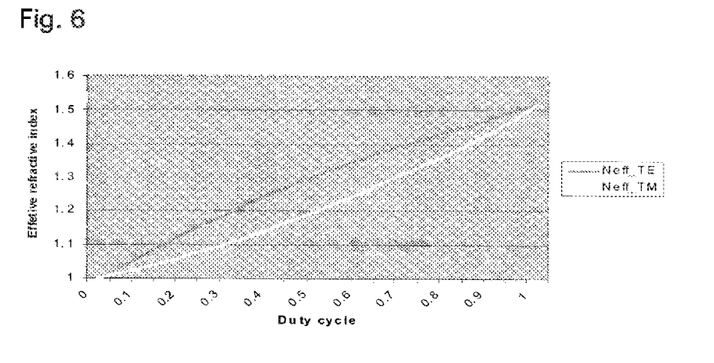
FIG. 6 depicts comparison of TE- and TM-polarized radiation as it reflects from different parts of the overlay target according to an embodiment of the present invention.

This concept is illustrated in FIG. 6. FIG. 6 shows the calculated effective refractive indices of a sub-wavelength grating as a function of the duty cycle (CD/pitch, where pitch is labeled with reference letter c) for TE- and TM-polarized radiation (light) incident on the grating. From FIG. 6, it can be seen that TE- and TM-polarized beams can experience different effective refractive indices as they propagate through a sub-wavelength grating. Applying the segmentation in the perpendicular fashion shown in FIG. 5 makes use of this. For instance, an inspection beam which is polarized along the grating vector 60 of the sub-segmented target will be experienced as a TE-beam for the part 52a that is sub-segmented along the grating vector direction 60 and as a TM-beam for the part 50a that is sub-segmented perpendicular to this vector 60. This means the different regions 50a, 52a of the target will have different effective refractive indices (also known as refractive index contrast), which is a requirement in order to give rise to a signal. By "signal", what is meant is a difference between the diffracted TM- and TE-beam intensities that may be measured by a detector or CCD camera. If there is a difference between the two polarized beams, a change in this difference if there is an overlay error is more easily noticed. As can be seen in FIG. 6, the effective refractive index contrast can be optimized by choosing different duty cycles (CD/c) for the segmentation on the lines and the spaces of the target and thus the signal can be maximized.

By applying the sub-segmentation as described above, the pitch range favorable by the sensor may be provided. At the same time, smaller and more precise design requirements may be complied with. Moreover, this design offers the possibility to tune the duty cycle to maximize the $1^{st}$ diffraction order signal, which is the diffraction order that usually provides the strongest signal (with the most easily measured asymmetry in the case of an overlay error).

Overlay measurement may be carried out on two of the targets shown in the bottom of FIG. 5 on top of each other or alternatively a 'normal' target may be superposed on a sub-segmented target, or vice-versa.

As a separate benefit, sub-wavelength periodic arrays of structures (i.e. bars or lines 42) as described above may thereby be created on the substrate using the exposure beam. Such gratings act as artificial crystals for the inspection wavelength. The macroscopic optical properties of such a crystal; for example, the effective real and imaginary parts of the refractive index, can be controlled accurately by the shape of the bars 42 and the periodicity of the 2-D arrays. This means that the macroscopic optical properties of the substrate may be tailored for the inspection wavelength. In particular, the inspection beam may be caused to scatter with a specific scatter spectrum when the overlay target is aligned with the projection system transmitting the inspection beam. A detector positioned to detect the scatter spectrum then calculates whether the inspection beam is aligned by its spectrum, and by how much it is misaligned by changed parameters in the spectrum. The tailoring of the optical properties of the substrate is a consequence of the fact that the wavelength of the exposure beam may be (much) smaller than the wavelength of the inspection beam. The optical properties for the wavelength of the inspection beam may be controlled by making use of the imaging capabilities of the wavelength of the exposure beam.

By having these lines 42 and spaces 40 smaller than the inspection beam wavelength, but larger than the exposure beam wavelength, artificial materials are created with controlled optical properties. The optical properties may be the real (refractivity or reflectivity) and imaginary (absorption) part of the effective refractive index. Artificial materials with controlled optical properties for the inspection wavelengths can be made by making use of lithographic techniques, i.e. when these inspection techniques are used in lithography, the lithographic apparatus itself may be used to create the overlay targets. By using targets with a grating period smaller than the wavelength of inspection beam, the incident radiation (light) will not be able to resolve these features and therefore will see the structure as a homogenous medium. This homogenous medium will have an effective refractive index (both real and imaginary) that is dependant on the refractive indices of the material making up the structure and the geometry of the structure (i.e. the period and duty cycle) as described above.

The benefit of this overlay target system is that the optical properties of a substrate for the inspection wavelength may be created and tailored using the exposure wavelength but for the benefit of the inspection wavelength.

The overlay targets can also be applied to other process layers, such as a deep trench layer, local inter-connect layers, etc. The sub-segmented gratings can be applied in overlay targets but also as anti-reflection layers.

These overlay targets in substrates may also be known as photonic crystals or sub-wavelength surfaces that are etched into silicon substrates and exhibit antireflection characteristics. They may be made by holographically recording a crossed-grating in a photo-resist mask followed by reactive-ion etching to transfer the primary mask onto the substrate (e.g. using the exposure beam). More information on how this sort of structure may be made may be found in "Anti-reflection behavior of silicon sub-wavelength periodic structures for visible light", Lalanne and Morris, Nanotechnology 8 (1997) 53-56 incorporated herein in its entirety by reference.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An inspection method for inspecting an overlay error of a target on a substrate, comprising:
    providing the target comprising a grating formed by an array of first regions alternating with second regions and arranged to repeat with a grating pitch of approximately 400 nm-1000 nm in a grating vector direction, the first regions comprising periodic arrays of structures oriented in a first direction and arranged to repeat with a first pitch smaller than the grating pitch and the second regions comprising periodic arrays of structures oriented in a direction different from the first direction and arranged to repeat with a second pitch smaller than the grating pitch;
    illuminating the target with a polarized inspection radiation beam, the first and second pitches being less than a wavelength ($\lambda$) of the inspection radiation beam divided by a refractive index (n) of a material in which the periodic arrays are provided;
    detecting the polarized inspection radiation beam reflected from the target;
    determining a feature in a diffraction spectrum of the reflected polarized inspection radiation beam, wherein the determined feature is based on a misalignment of the target with a second target provided on top of or beneath the target; and
    determining the overlay error based on the determined feature.

2. The method according to claim 1, wherein the direction of the periodic arrays of structures of the second regions is substantially orthogonal to the first direction.

3. The method according to claim 2, wherein the periodic arrays of structures of the first regions are aligned with the grating vector direction and the periodic arrays of structures of the second regions are substantially perpendicular to the grating vector direction.

4. The method according to claim 1, wherein the first regions comprise different effective refractive indices from the second regions.

5. The method according to claim 1, wherein the array of first and second regions is arranged such that a polarized radiation beam reflecting from a surface of the target acts as a TE-polarized beam when reflecting from the first regions and as a TM-polarized beam when reflecting from the second regions.

6. The method according to claim 1, wherein a pattern and periodicity of the structures in the first and second regions affect real and imaginary parts of a refractive index of a material containing the structures.

7. The method according to claim 1, wherein the array forms an anisotropic target.

8. The method according to claim 1, wherein the array comprises a photonic crystal.

9. The method according to claim 1, wherein the array is 2-dimensional.

10. The method according to claim 1, wherein the target is applied to one or more resist layers on the substrate.

11. The method according to claim 1, wherein the target is applied to a deep trench layer.

12. The method according to claim 1, wherein the target is applied to a process layer in a lithographic apparatus.

13. The method according to claim 1, wherein the target is used in a stacked configuration.

14. The method according to claim 1, wherein the first pitch is different than the second pitch.

15. The method according to claim 1, wherein the second target is on a layer of the substrate underneath the target, wherein the second target comprises a second grating formed by an array of third regions alternating with fourth regions and arranged to repeat with the grating pitch in the grating vector direction.

16. The method according to claim 1, wherein the detecting the polarized inspection radiation beam comprises:
    detecting a TE-polarized beam and a TM-polarized beam reflected from the first and second regions from the polarized inspection radiation beam;
    measuring a difference between intensities of the TE-polarized beam and the TM-polarized beam; and
    determining a duty cycle for the first regions to maximize the measured difference between the intensities.

17. The method according to claim 1, wherein the target is provided in-die on the substrate.

18. An inspection method for inspecting an overlay error of a grating on a substrate, comprising:
    providing an array of first regions of the grating arranged to repeat with a grating pitch of approximately 400 nm-1000 nm in a grating vector direction, the first regions containing reflective structures superimposed on the pattern on the substrate and arranged to repeat with a first pitch smaller than the grating pitch;
    providing an array of second regions of the grating containing reflective structures interleaved with the first regions, the reflective structures of the second regions being arranged substantially perpendicularly to the reflective structures of the first regions and arranged to repeat with a second pitch smaller than the grating pitch;
    illuminating the first and second regions with a polarized inspection radiation beam, the first and second pitches being less than a wavelength ($\lambda$) of the inspection radiation beam divided by a refractive index (n) of a material in which the periodic arrays are provided;
    detecting the polarized inspection radiation beam reflected from the first and second regions;
    determining a feature in a diffraction spectrum of the reflected polarized inspection radiation beam, wherein the determined feature is based on a misalignment of the target with a second target provided on top of or beneath the grating; and
    determining the overlay error based on the determined feature.

19. The method according to claim 18, wherein the first pitch is different than the second pitch.

20. The method according to claim 18, wherein the second grating is on a layer of the substrate underneath the grating, wherein the second grating is formed by an array of third regions alternating with fourth regions and arranged to repeat with the grating pitch in the grating vector direction.

21. The method according to claim 2, wherein the detecting the polarized inspection radiation beam comprises:
    detecting a TE-polarized beam and a TM-polarized beam reflected from the first and second regions from the polarized inspection radiation beam;
    measuring a difference between intensities of the TE-polarized beam and the TM-polarized beam; and determining a duty cycle for the first regions to maximize the measured difference between the intensities.

* * * * *